United States Patent [19]

Eul

[11] Patent Number: 5,539,749

[45] Date of Patent: Jul. 23, 1996

[54] METHOD FOR MERGING DATA STREAMS

[75] Inventor: Hermann-Josef Eul, Oberschleissheim, Germany

[73] Assignee: Siemens Aktiengesellschaft, Munich, Germany

[21] Appl. No.: 277,574

[22] Filed: Jul. 20, 1994

[30] Foreign Application Priority Data

Sep. 13, 1993 [DE] Germany ............ 43 31 040.0

[51] Int. Cl.⁶ .................................. H04J 3/16
[52] U.S. Cl. ............ 370/95.3; 370/112; 379/60; 455/332
[58] Field of Search ............ 370/60, 94.1, 60.1, 370/61, 94.2, 94.3, 85.6, 79, 112, 95.1, 95.3; 340/825.5, 825.51; 379/59, 60; 455/33.1, 33.2, 54.1, 58.1, 56.1

[56] References Cited

U.S. PATENT DOCUMENTS

| | | | |
|---|---|---|---|
| 4,718,081 | 1/1988 | Brenig | 379/60 |
| 5,121,383 | 6/1992 | Golestani | 370/60 |
| 5,132,966 | 7/1992 | Hayano et al. | 370/94.1 |
| 5,267,261 | 11/1993 | Blakeney, II et al. | 375/1 |

FOREIGN PATENT DOCUMENTS

| | | |
|---|---|---|
| 78104/91 | 12/1991 | Australia . |
| 0392603 | 10/1990 | European Pat. Off. . |
| 0594354A2 | 4/1994 | European Pat. Off. . |
| 2630084 | 1/1977 | Germany . |
| 3423289A1 | 1/1986 | Germany . |

*Primary Examiner*—Douglas W. Olms
*Assistant Examiner*—Ajit Patel
*Attorney, Agent, or Firm*—Hill, Steadman & Simpson

[57] ABSTRACT

A method for merging data streams generated by a plurality of base stations in a cellular mobile radio telephone network upon receipt by each base station of a mobile unit signal transmitted by a mobile unit, wherein each base station routes the mobile unit signal in the form of a stream of data in blocks of data bits, each bit in each block having associated therewith a reliability value generated by its respective base station, the various streams of data generated by the base stations are received at a unification point, and a unified signal is generated out of the various base station streams of data in the form of a composite data stream by selecting each bit thereof from corresponding bits in the various base station streams of data.

8 Claims, 2 Drawing Sheets

METHOD FOR MERGING DATA STREAMS

BACKGROUND OF THE INVENTION

The present invention is directed to methods for merging data streams. More specifically, the invention is directed to methods for merging data streams from base stations in a cellular mobile radio telephone network.

In cellular mobile radio telephone services, full coverage is usually achieved by spatially arranging base stations such that the areas covered by the cells associated therewith overlap. When a subscriber moves from within one cell to within another cell, the call is forwarded to the second cell's base station by handing over the call at the cell boundary.

In reality, the cell boundaries are not sharply defined but have a more or less diffuse character which depends on topographical conditions. In order to reliably forward the subscriber to a neighboring station and to avoid multiple handovers, the cells are designed to overlap. However, this leads to higher infrastructure costs and, thus, to reduced economic feasibility of mobile radio telephone networks.

What will be referred to herein as soft handovers, also called macro diversity, has been proposed for future networks in order to avoid this disadvantage. In this arrangement, the connection to a mobile station is maintained by two or more base stations when the mobile station is located in a cell boundary region. The signals of the participating base stations are then routed to a common point. A quality criterion, for example the average reception field strength during the reception of a voice block, is associated block by block with a signal. That block of the various blocks which are forwarded to the unification point which has the best quality criterion, is the block selected for being propagated to the next network element.

SUMMARY OF THE INVENTION

The present invention provides a method for reliably handing over a mobile radio telephone subscriber signal between different base station of a cellular mobile radio telephone network.

In an embodiment, the invention provides that the signal transmitted by a mobile station is simultaneously received by a plurality of base stations within range, and the base stations then transmit the received data blocks to a unification point along with reliability information for each and every bit of a data block, and then at the unification point a composite signal is generated bit by bit based on the reliability information.

These and other features of the invention will become clearer below with reference to the following detailed description of the presently preferred embodiment with reference to the accompanying drawings.

DETAILED DESCRIPTION OF THE PRESENTLY PREFERRED EMBODIMENTS

The present invention takes advantage of the fact that modern signal processing algorithms usually supply quality information for each bit in a data stream. These so-called fuzzy logic or soft decision methods supply a quality criterion which is far more telling than simply the reception field strength. Thus, the invention is based on three complementary measures: the fuzzy logic or soft decision information generated at a base station is forwarded to the unification point; decisions about the selection are made at the unification point bit by bit and not block by block; and the combination of the incoming data streams is undertaken with a suitable unification method (for example, another fuzzy logic or soft decision method) instead of on the basis of a selection method.

It should be noted that the method described herein is only directed to the uplink of a mobile station connection. However, the uplink is usually the most problematical part of the mobile telephone communication connection. Nevertheless, macro-diversity is also possible in a downlink but in that case the method would be fundamentally different.

Figure 1:
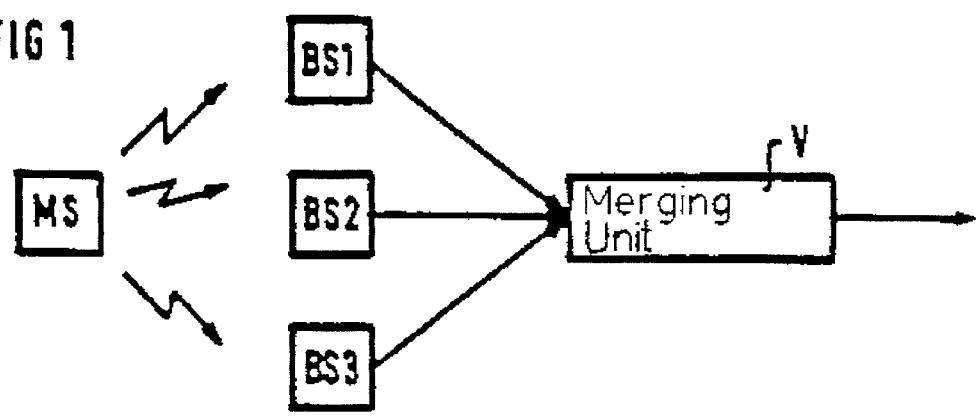
FIG. 1 illustrates a sketch of a signal path in a cellular telephone system.

With reference to FIG. 1, a signal path for the transmission of the received signal from a mobile station MS can be seen. The signal transmitted from the mobile station MS is simultaneously received by a plurality of base stations being located within the range of the mobile station MS, in this example, base stations BS1, BS2 and BS3. It can be appreciated that the number of base stations within the range of a mobile station is not necessarily limited, however, as a practical matter it will generally be about three stations, depending on the amount of overlap between cells. As is illustrated, the base stations receiving the signal transmitted by the mobile station MS forward received data blocks in the signal to a unification point at which a unification unit V is arranged. As will be described later, at the unification point a composite signal is generated.

Figure 2:
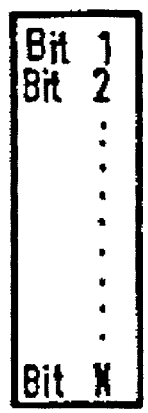
FIG. 2 illustrates a data block.

As discussed above, in accordance with conventional methods for voice communication, voice blocks are provided with quality information, for example, information directed to the reception level, and such quality information is transmitted to the unification point. In FIG. 2, there is illustrated a data block, the data block being comprised of a series of bits, Bit 1 through Bit N. In accordance with conventional methods, the unification unit V propagater the data block having the best quality value to the composite signal.

Figure 3:
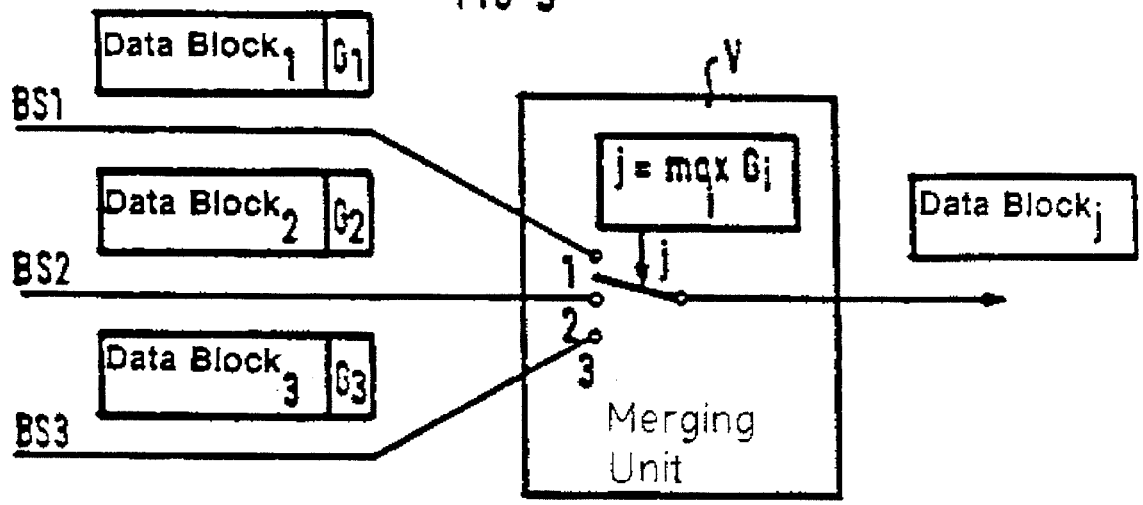
FIG. 3 illustrates a unification point for unifying data from various data blocks from various base stations.

In FIG. 3, there is illustrated a signal path wherein the data blocks received by the various base stations are transmitted to the unification unit V. Also depicted is a quality value G1, G2 and G3 associated with respective data blocks 1, 2 and 3.

Based on the quality information G1, G2 and G3, the unification unit V selects for the output signal that data block having the best quality value G1, G2 or G3. For this purpose, the unification unit, wherein the selection is made, switches a switch-over means, the switch-over means being driven by the criteria j=maxGi, i=1 to 3. As a result, the selected block j is forwarded on to the continuing transmission path.

Figures 4, 5:
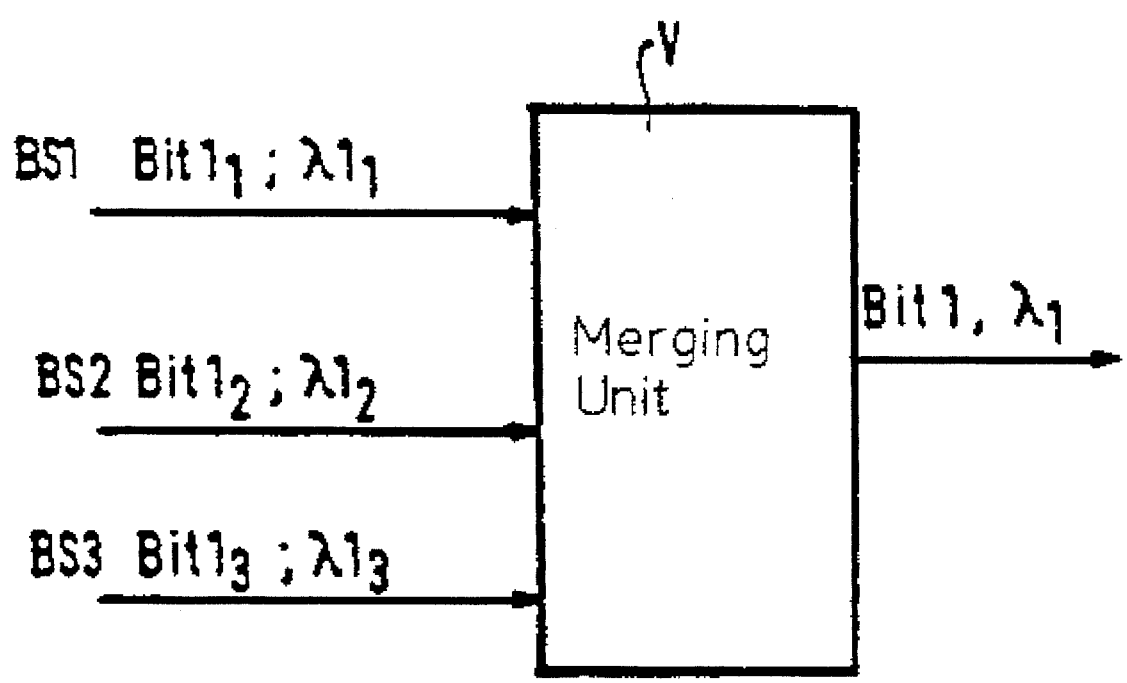
FIG. 4 illustrates a data block having attached reliability information.
FIG. 5 illustrates a unification point for various data streams.

In contrast thereto, in the method of the invention, soft decision reliability information λ, is also sent for each individual bit. This is illustrated in FIG. 4. Such reliability information is offered by modern signal processing algorithms and, accordingly, is available in the base stations.

As the term implies, the reliability information provides information about the reliability with which the respective bit was detected in the detection process and is far more telling about the quality of the reception of the bit than information about the reception field strength. For example, the reception can be relatively qualitatively poor despite good field strength when the connection is disturbed, for example, by interference signals. Moreover, the mobile radio telephone connection can be subjected to rapid fluctuations, for example, due to fading, so that shorter sequences of bits can be highly degraded despite an adequate average field strength.

In FIG. 5, there is illustrated the unification of signals from three base stations, BS1, BS2 and BS3 that are combined by means of a unification unit V at a unification point. After evaluation or identification of the respective bits of a data block of the signal paths, a bit by bit joining of the data blocks ensues in the unification unit V by means of a suitable unification method, for example, a fuzzy logic or soft decision process. As a result, the maximum information from each block is introduced into the unification process.

In FIG. 5, the comparison of the first bit of the three versions of a given data block with their associated reliability information $\lambda 1, \lambda 2, \lambda 3$ is shown.

It should be noted that a rather high degree of freedom is possible in the illustration of bits and soft decision information. So, for the purposes of the following discussion, the following assumption about the presentation form can be made for explaining the basic function. For purposes of this discussion, the value of a bit can be +1 or −1, whereby a bit=1 represents the logical value "1" and bit=−1 represents the logical value "0". The reliability information $\lambda$ can lie in the range 0.0 to 1.0. In this case of $\lambda=0.0$ identifies a bit that is absolutely unreliable. Conversely, the value $\lambda=1.0$ characterizes a bit that is the most highly reliable.

Based on this definition of bits and reliability information, the unification process can be described with the following equations:

$$\text{Bit}1 = \text{sign} \sum_i \lambda 1_i \cdot \text{Bit}1_i \text{ and} \quad (1)$$

$$\lambda 1 = \text{abs} \sum_i \lambda 1_i \cdot \text{Bit}1_i \quad (2)$$

As can be appreciated, the sign function (equation (1)) extracts the operational sign and, thus, the bit value of a given bit while the absolute value function (equation (2)) extracts the reliability information for a given bit. Accordingly, in the example illustrated in FIG. 5, Bit 1, $\lambda 1$, which forms the first position of the data block of the composite signal or unified data stream appears at the output of the unification unit V, $\lambda 1$. Bits in a given data block following thereafter are handled in the same manner.

In view of the foregoing, it can be appreciated that the method of the present invention then is based on three measures:

1. The soft decision information present in a base station is forwarded to the unification point as illustrated in FIG. 4.
2. The decision about the propagation of a data stream occurs bit-by-bit as illustrated in FIG. 5. As a result, the best information from each data block is used.
3. A further enhancement of the efficiency of the system is achieved by suitably merging the incoming data streams instead of employing the selection method. This has the advantage that all existing information is utilized. Moreover, a quality criterion for each bit is again available at the output of the unification process. The quality criterion at the output can then be used by soft decision input to voice coders and can, thus, again contribute to an enhancement of the voice quality. However, for conventional voice coders or other data connections may be neglected. Nonetheless, the gain through the use of a soft decision unification is preserved.

Although modifications and changes may be suggested by those skilled in the art, it is the intention of the inventors to embody within the patent warranted hereon all changes and modifications as reasonably and properly come within the scope of their contribution to the art.

I claim:

1. A method for merging data streams generated by a plurality of base stations in a cellular mobile radio telephone network upon receipt by each base station of a mobile unit signal transmitted by a mobile unit, comprising the steps of:

each base station routing the mobile unit's signal in the form of a stream of data in blocks of data bits, each bit in each block having associated therewith a reliability value, which provides information about the reliability of the recognition of the bits;

receiving at a unification point the streams of data generated by the base stations; and generating in a merging unit connected with the unification point a unified signal out of the base station's streams of data in the form of a composite data stream by selecting each bit thereof from bits of the various base station's streams of data received at the unification point, taking the respective reliability values for the bits of the different base stations+ streams of data into account.

2. The method of claim 1, wherein said composite data stream is generated using a soft decision process wherein each bit of the composite data stream is selected from the corresponding bits in said base station generated streams of data using respective reliability values for the bits of the different streams of data.

3. The method of claim 2, wherein each bit for said composite data stream is selected based on the following relationships:

$$\text{Bit}x = \text{sign} \sum_{i=1}^{n} \lambda x_i \cdot \text{Bit}x_i \text{ and}$$

$$\lambda x = \text{abs} \sum_{i=1}^{n} \lambda x_i \cdot \text{Bit}x_i$$

where $\lambda x$ is the reliability value for a given bit x and i identifies a given base station.

4. The method of claim 1, wherein said reliability value is a soft decision value.

5. A method for merging data streams in a cellular mobile radio telephone network, whereby the signal transmitted by a mobile station is simultaneously received by a plurality of base stations and the base stations send the received signal in the form of data blocks via a merge point connected with a merging unit, characterized by the following steps:

a reliability information which provides information about the reliability of the recognition of the bits is generated and attached to every bit of a data block;

a bit-by-bit decision about the forwarding of the data streams ensues in the merging unit on the basis of an evaluation of the corresponding bits of the various data blocks, taking the reliability information for the respective bits into account; and the merging of the data streams from bits of the data blocks of various base stations is realized.

6. The method of claim 5, wherein said merged data streams are generated using a soft decision-process wherein each bit of the merged data stream is selected from corresponding bits in said data blocks from said base stations using said reliability value of the bits.

7. The method of claim 6, wherein each bit for the composite data stream is selected based on the following relationships:

$$\text{Bit}x = \text{sign} \sum_{i=1}^{n} \lambda x_i \cdot \text{Bit}x_i \text{ and}$$

-continued $$\lambda x = \text{abs} \sum_{i=1}^{n} \lambda x_i \cdot \lambda_i \cdot \text{Bit}x_i$$

where $\lambda x$ is the reliability value for a given bit x and i identifies a given base station.

8. The method of claim 5, wherein said reliability value is a soft decision value.

* * * * *